United States Patent [19]
Kobor

[11] Patent Number: 5,510,010
[45] Date of Patent: Apr. 23, 1996

[54] COPPER ARTICLE WITH PROTECTIVE COATING

[75] Inventor: Richard G. Kobor, Syracuse, N.Y.

[73] Assignee: Carrier Corporation, Syracuse, N.Y.

[21] Appl. No.: 203,813

[22] Filed: Mar. 1, 1994

[51] Int. Cl.$^6$ .................................. C25D 13/00
[52] U.S. Cl. ................. 204/488; 205/188; 205/210
[58] Field of Search ................ 204/180.2, 181.1; 205/210, 215, 188

[56] References Cited

U.S. PATENT DOCUMENTS

| | | | |
|---|---|---|---|
| 3,197,672 | 8/1965 | De Hart | 148/6.14 |
| 5,098,527 | 3/1992 | Banks et al. | 204/181.1 |
| 5,145,733 | 9/1992 | Kadokura | 428/551 |
| 5,288,377 | 2/1994 | Johnson et al. | 204/181.7 |

FOREIGN PATENT DOCUMENTS

| | | |
|---|---|---|
| 44799 | 2/1990 | Japan . |
| 58898 | 2/1990 | Japan . |

*Primary Examiner*—John Niebling
*Assistant Examiner*—Kishor Mayekar

[57] ABSTRACT

A copper heat exchanger unit for operating in a harsh environment wherein the exposed surfaces of the unit are first provided with a black oxide layer and then electrocoated with a protective acrylic barrier.

5 Claims, 2 Drawing Sheets

COPPER ARTICLE WITH PROTECTIVE COATING

BACKGROUND OF THE INVENTION

This invention relates to protecting copper articles from a corrosive environment, and in particular, to protecting copper heat exchangers used in refrigerated cargo containers.

Ocean going cargo ships now carry large containers on their open decks which serve to expand the ship's utility. Many of these containers are equipped with refrigeration systems so that they can store perishable goods for relatively long periods of time. The refrigeration systems, however, are exposed to salt, air and water which causes the exposed parts to corrode at an accelerated rate. Heat exchanger surfaces used in the refrigeration systems are particularly susceptible to salt air and salt water corrosion.

In an effort to combat the harmful effects of salt, air and water, heat exchangers used in sea going containers are typically fabricated of copper. In addition, exposed surfaces of the heat exchangers have also been coated with various types of paints for added protection. These protective coatings have met with only with limited success for a number of reasons. First, most coating materials do not adhere well to copper and eventually the coating will flake away to expose the copper substrate. Secondly, the coating must be relatively thin so that it does not adversely effect the heat transfer characteristics of the heat exchanger. Most thin layer coatings, however, are extremely porous and thus will not establish an impenetrable protective barrier for the underlying copper.

As will be described in greater detail below, the present invention will be explained with specific reference to providing a protective barrier for a copper heat exchanger. However, it should be evident to one skilled in the art that the invention is not limited to this specific application and can be used in connection with any copper article where the need exists to protect the article from a hostile environment or the like.

SUMMARY OF THE INVENTION

It is therefore an object of the present invention to protect copper articles from a corrosive environment.

It is another object of the present invention to protect a copper heat exchanger from the harmful effects of salt air and water.

Yet a further object of the present invention is to extend the life of refrigeration systems used in sea going cargo containers.

A still further object of the present invention is to provide a protective overcoating for a copper heat exchanger that will not adversely effect its heat transfer properties, but yet will provide a relatively non-porous barrier to salt air and water.

Another object of the present invention is to provide a protective coating for a copper article that has improved adhesion properties.

These and other objects of the present invention relate broadly to a copper article, and more specifically, to a heat exchanger for use in a sea going refrigeration cargo container. The exposed surface of the articles are first treated to produce a black oxide layer over the exposed surfaces. An acrylic outer layer is then electro-coated over the oxide layer to provide a relatively thin yet non-porous barrier that exhibits extremely good adhesion and protective properties against corrosive substances.

BRIEF DESCRIPTION OF THE DRAWINGS

For a better understanding of these and other objects of the present invention, reference is made to the detailed description of the invention which is to be read in conjunction with the following drawings, wherein.

DESCRIPTION OF THE INVENTION

Figure 1:
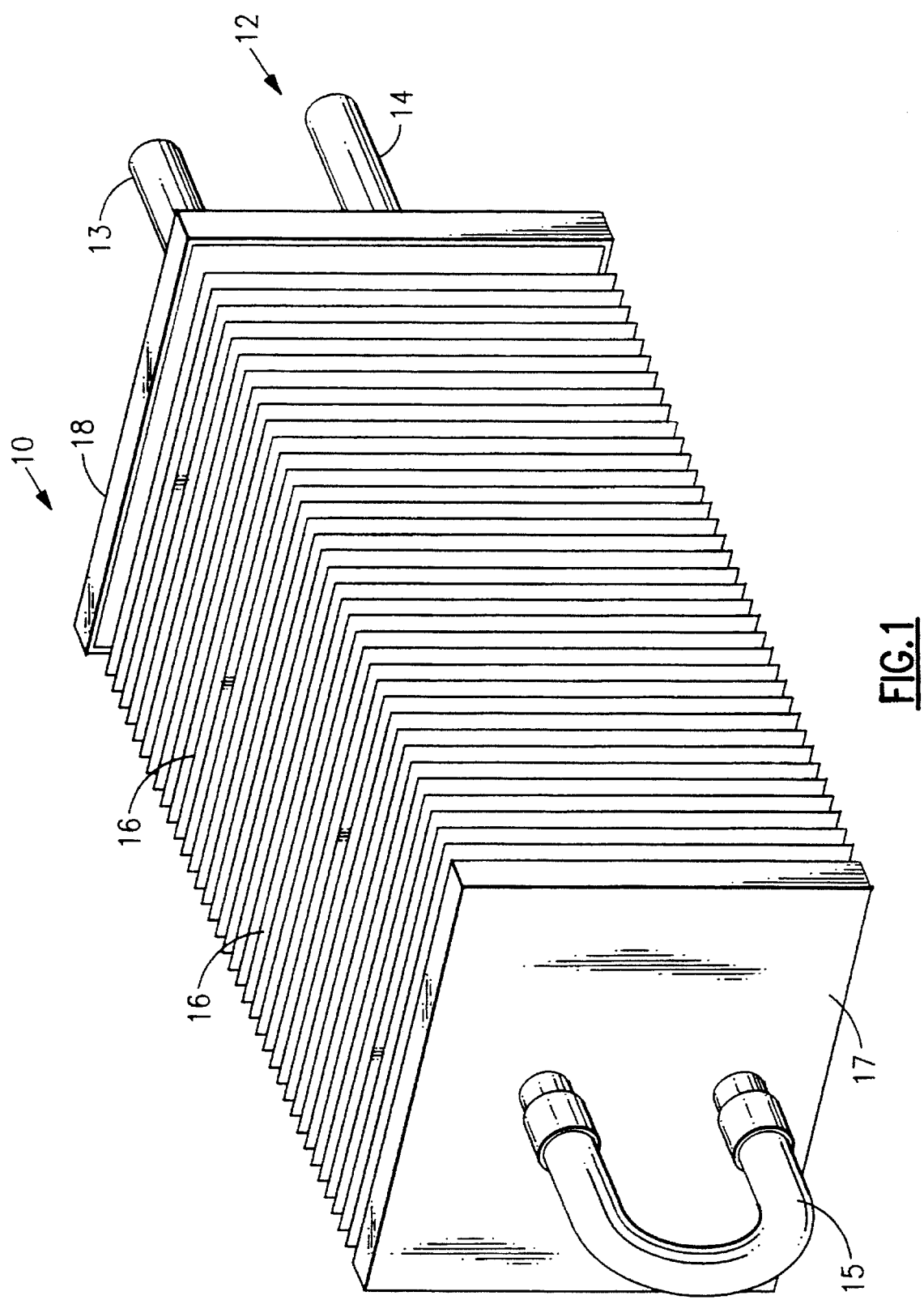
FIG. 1 is a perspective view of one form of copper heat exchanger used in refrigerated sea going cargo containers.

Referring initially to FIG. 1, there is shown a fin coil heat exchanger, generally referenced 10, of the type typically used in association with refrigerated cargo containers. The heat exchanger includes one or more flow circuits 12 for carrying a refrigerant through the heat exchanger unit. For the purposes of explanation, the unit illustrated in FIG. 1 contains a single flow circuit 12 consisting of an inlet line 13 and an outlet line 14 which are connected at one end of the exchanger by means of a 90° tube bend 15. It should be evident, however, that more circuits may be added to the unit depending upon demands of the system. The unit further includes a series of radially disposed plate-like elements 16—16 that are spaced apart along the length of the flow circuit. The elements are supported in assembly between a pair of end plates 17 and 18 to complete the assembly.

As noted above, heat exchangers of this type that are exposed to a harsh or corrosive environment are generally fabricated of copper because of its good heat transfer properties and resistance to corrosion. Nevertheless, these copper units can and will be adversely effected when exposed to salt air and water for extended periods of time. Attempts have been made with varying degrees of success to coat these copper units with various material in an effort to extend the useful life of the unit. These coating materials oftentimes reduce the heat transfer capacity of the unit, exhibit poor adhesion properties and fail to penetrate into all areas of the unit that might be exposed to a hostile environment.

As will be explained in greater detail below, the exposed outer surfaces of the present copper heat exchanger are first pretreated to establish a black oxide coating thereon that creates a strong boundary layer much like that produced when aluminum is anodized. A thin acrylic overcoating is then electro-coated over the black oxide boundary layer to provide a strongly adhering protective barrier for extending the useful life of a unit exposed to a hostile environment. It has been found that this combination exhibits unexpected synergistic results and does not degrade the heat transfer properties of the unit. Additionally, the protective barrier is capable of penetrating deeply into remote, difficult to access areas, thus preventing early failure.

Figure 2:
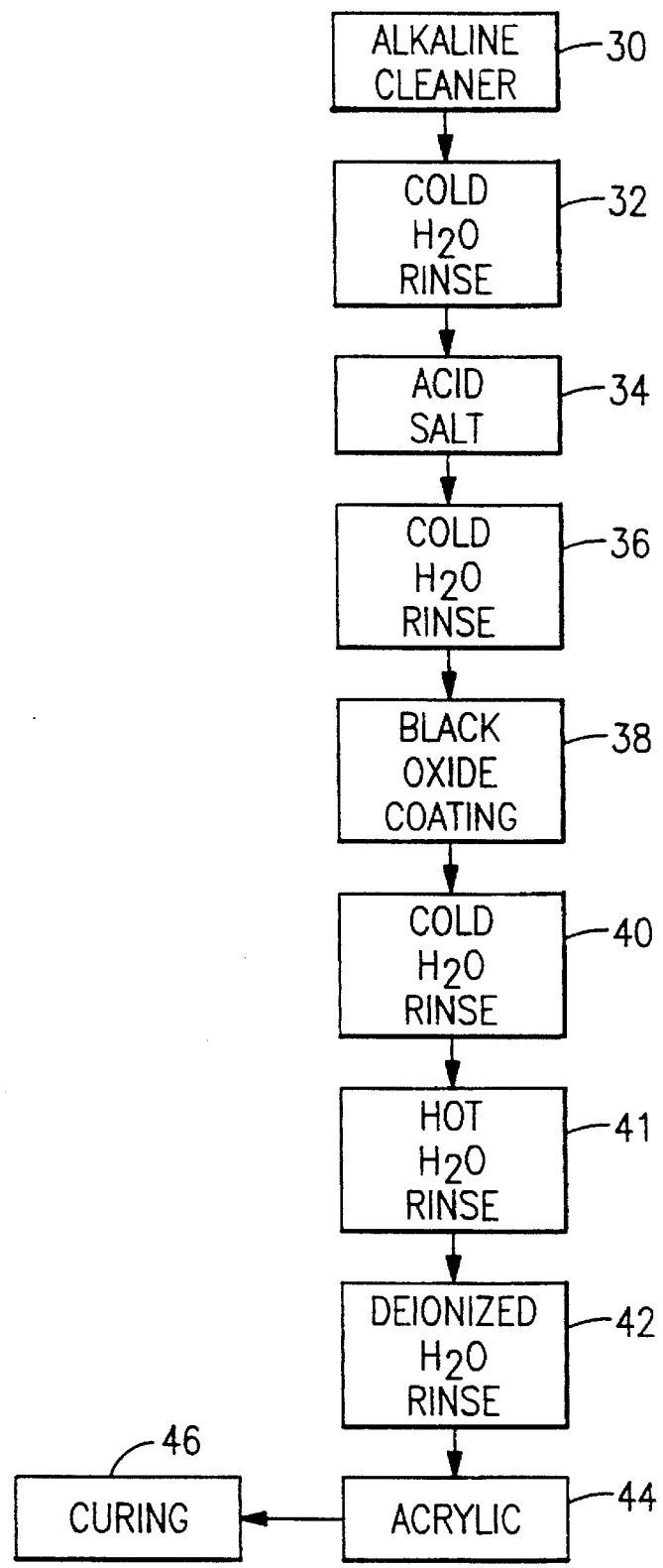
FIG. 2 is a flow diagram showing the steps involved in providing a strongly adhesive, non-porous protective barrier to the exposed surfaces of the heat exchanger illustrated in FIG. 1.

Turning now to FIG. 2, there is shown a flow process diagram depicting the process steps involved in producing a uniform protective barrier over the entire outer surface of the copper heat exchanger. Initially, the two open ends of the flow circuit are closed by suitable plugs (not shown) and the exchanger is immersed in an alkaline bath 30 containing a strong base cleaner such as MI Clean 17 manufactured by Mitchell Bradford International, which is a division of Hubbard-Hall, Inc. of Waterbury, Conn. The bath contains a 4–7% concentration of MI Clean 17 in water and the solution is heated to a temperature of about 180° F. The alkaline bath may also contain a 4 to 7% solution of sodium silicate in water. The heat exchanger is allowed to remain in the bath for about 5 to 10 minutes to thoroughly clean and degrease all exposed surfaces of the unit.

Upon removal from the alkaline bath, the unit is bathed in a cold water rinse 32 for about one minute or a period of time which is sufficient to remove the alkaline wash from the outer surface of the exchanger. The term cold water rinse as herein used refers to one in which the rinse water is at or about an ambient temperature.

The rinsed heat exchanger is then placed in a second acidic cleansing bath 34 for about 4 to 5 minutes to remove surface oxidations. The bath, held at an ambient temperature, contains about 10% concentration of Scone M-E Acid Brite 50 (also supplied by Hubbard-Hall, Inc.) in water. Acid Brite 50 contains about 20% by weight hydrochloric acid, 11% by weight phosphoric acid and 10% by weight sulfuric acid along with other non-acidic materials which combine to thoroughly ride the outer surfaces of the heat exchanger of unwanted oxides.

The unit, upon removal from the acid cleaning bath, is immediately placed in a cold water rinse 36 for about one minute or more to remove all trace of the acid bath from the outer surfaces of the unit.

The twice cleaned and rinsed part is now immersed in an oxidizing bath 38. The bath contains an oxidizing solution containing equal parts sodium hydroxide and sodium chloride in water. A concentration of about two pounds of oxidizer to a gallon of water is used. The oxidizer is commercially available from Hubbard-Hall, Inc. and is sold under the tradename Black Magic CB. The unit is allowed to remain in the bath for between 5 and 10 minutes at a bath temperature of about 180° F.–210° F. until all exposed surfaces of the copper are thoroughly coated with a deep black colored oxide film.

The oxidation process is quickly terminated by rinsing the unit in cold water for two to three minutes and then in hot water that is heated to about 120° F. for about ten or eleven minutes. The unit is given a final rinse for about one to two minutes in deionized water at ambient temperature and allowed to dry. These rinses are depict at 40–42 in FIG. 2.

Upon drying, the unit is coated with an acrylic paint using commercially available coating equipment 44. The paint is available from Pittsburgh Plate Glass Industries, Inc. of Springdale, Pa. and is sold under the tradename Powercron 810-611 or Powercron 830-611. The oxidized unit is immersed in a bath of acrylic paint and an electrical current of ~234 amps and 200 volts applied to the unit. The unit is held in the bath for between nine and ten minutes to insure that all exposed and oxidized surfaces of the unit are fully covered with the acrylic overcoat to a thickness of between 0.0005 to 0.0010 inches. The unit is then removed from the bath and the paint Cured in an oven 48 for thirty minutes at 375° F.

Copper parts that were oxidized and coated by the method described above were tested to determine the parts' ability to resist corrosion. The AC impedance of each coated part was first measured and recorded. The average impedance of the parts was found to be about $8\times10^9$ ohms per square centimeter and the average thickness of the acrylic coating was about 0.0007 inches. The parts were then exposed to steam spray for a period of about 48 hours and a second impedance measurement was then taken. The average impedance of the parts exposed to the steam was found to be about $7\times10^8$ ohms per square centimeter. Clearly these tests showed that the acrylic coating was relatively less porous than similar coating presently in use and thus provided an improved protective barrier against corrosion. Further tests also showed that the coating exhibited improved adhesive properties and resistivity to ultraviolet radiation when compared to presently employed coatings.

Although the present invention has been described with specific reference to a copper heat exchanger, it should be evident to one skilled in the art that the invention has wider applications and can be employed in conjunction with any type of copper article or part that may require extended protection from a hostile environment.

While this invention has been explained with reference to the structure disclosed herein, it is not confined to the details set forth and this invention is intended to cover any modifications and changes as may come within the scope of the following claims:

What is claimed is:

1. A method of protecting a copper heat exchanger against corrosion that includes the steps of:

providing a copper heat exchanger which contains a plurality of spaced apart fins, precleaning and degreasing exposed surfaces of said heat exchanger followed by immersing the heat exchanger in an acid bath to remove unwanted oxides from the exposed surfaces, and then washing the heat exchanger with water, immersing the heat exchanger in an aqueous oxidizing bath for a period of time sufficient to establish a uniform black oxide covering exposed surfaces of the heat exchanger, rinsing said heat exchanger after the oxidizing step in successive baths of cold water, hot water, and deionized water, and electrocoating said oxidized surfaces with a non-conductive acrylic paint to provide a continuous protective barrier over said exposed surfaces against corrosion.

2. The method of claim 1 wherein the acrylic paint is electrocoated to a uniform thickness of about between 0.0005 and 0.0010 inches.

3. The method of claim 1 wherein said heat exchanger is immersed in said aqueous bath for between 4 and 6 minutes.

4. The method of claim 1 wherein the electrocoating step lasts between nine and ten minutes so that the article has an AC impedance of between $10^8$ and $10^9$ ohms per $cm^2$.

5. The method of claim 1 that includes the further step of curing the acrylic paint coating in an oven at 350° F. to 400° F. for about thirty minutes.

* * * * *